(12) United States Patent
Pezeshki et al.

(10) Patent No.: US 12,184,331 B2
(45) Date of Patent: *Dec. 31, 2024

(54) HIGH SPEED AND MULTI-CONTACT LEDS FOR DATA COMMUNICATION

(71) Applicant: AvicenaTech Corp., Mountain View, CA (US)

(72) Inventors: Bardia Pezeshki, Mountain View, CA (US); Robert Kalman, Mountain View, CA (US); Alex Tselikov, Mountain View, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/465,924

(22) Filed: Sep. 12, 2023

(65) Prior Publication Data

US 2024/0072895 A1     Feb. 29, 2024

Related U.S. Application Data

(63) Continuation of application No. 16/951,296, filed on Nov. 18, 2020, now Pat. No. 11,791,896.

(Continued)

(51) Int. Cl.
*H04B 10/00*     (2013.01)
*H01L 33/00*     (2010.01)
(Continued)

(52) U.S. Cl.
CPC ........ *H04B 10/116* (2013.01); *H01L 33/0008* (2013.01); *H01L 33/0016* (2013.01);
(Continued)

(58) Field of Classification Search
CPC .... H04B 10/116; H04B 10/502; H04B 10/40; H04B 10/1123; H04B 10/1143; H04B 10/1149; H01L 33/06; H01L 33/04; H01L 33/32; H01L 33/0008; H01L 33/0016; H01L 33/58
USPC ....... 398/172, 118, 119, 127, 128, 129, 130, 398/131, 135, 136, 137, 138, 139, 158, 398/159, 140, 141, 164, 182, 183; 372/45.01, 43.01, 44.01, 46.01;
(Continued)

(56) References Cited

U.S. PATENT DOCUMENTS 5,003,366 A    3/1991   Mishima et al.
5,818,984 A    10/1998   Ahmad et al.
(Continued)

FOREIGN PATENT DOCUMENTS

CN     102130221     7/2011
CN     106159047     11/2016
(Continued)

OTHER PUBLICATIONS

Office Action from U.S. Appl. No. 16/951,332 from USPTO dated Dec. 17, 2021.
(Continued)

*Primary Examiner* — Hanh Phan

(57) ABSTRACT

An LED may have structures optimized for speed of operation of the LED. The LED may be a microLED. The LED may have a p-doped region with one or more quantum wells instead of an intrinsic region. The LED may have etched vias therethrough.

11 Claims, 4 Drawing Sheets

Related U.S. Application Data

(60) Provisional application No. 62/971,844, filed on Feb. 7, 2020, provisional application No. 62/936,767, filed on Nov. 18, 2019.

(51) Int. Cl.

| | | |
|---|---|---|
| *H01L 33/04* | (2010.01) | |
| *H01L 33/06* | (2010.01) | |
| *H01L 33/32* | (2010.01) | |
| *H01L 33/58* | (2010.01) | |
| *H04B 10/116* | (2013.01) | |
| *H04B 10/50* | (2013.01) | |

(52) U.S. Cl.
CPC ............. *H01L 33/04* (2013.01); *H01L 33/06* (2013.01); *H01L 33/32* (2013.01); *H01L 33/58* (2013.01); *H04B 10/502* (2013.01)

(58) Field of Classification Search
USPC ..... 257/E33.056, E33.069, E33.059, 13, 54, 257/17
See application file for complete search history.

(56) References Cited

U.S. PATENT DOCUMENTS

| | | | | |
|---|---|---|---|---|
| 7,961,990 | B2* | 6/2011 | Krishnamoorthy | ........................... H01L 25/0657 398/139 |
| 8,779,425 | B2* | 7/2014 | Moon | ..................... H01L 33/04 257/54 |
| 8,816,383 | B2* | 8/2014 | Mohammed | ............ H01L 33/62 257/E33.056 |
| 9,978,909 | B2 | 5/2018 | Grundmann et al. | |
| 10,002,928 | B1 | 6/2018 | Raring et al. | |
| 10,840,408 | B1* | 11/2020 | Yin | ....................... H01L 33/025 |
| 10,985,046 | B2 | 4/2021 | Paranjpe et al. | |
| 11,791,896 | B2* | 10/2023 | Pezeshki | ................. H01L 33/20 398/172 |
| 2014/0001483 | A1 | 1/2014 | Rand et al. | |
| 2014/0023376 | A1 | 1/2014 | Gabrel | |
| 2015/0243648 | A1 | 8/2015 | Edwards | |
| 2015/0349200 | A1 | 12/2015 | Chen et al. | |
| 2016/0020353 | A1 | 1/2016 | Chen-Fu | |
| 2019/0035967 | A1 | 1/2019 | Zhaowei et al. | |
| 2019/0088633 | A1 | 3/2019 | Tao et al. | |
| 2020/0135968 | A1 | 4/2020 | Daami et al. | |
| 2021/0152244 | A1 | 5/2021 | Pezeshki et al. | |
| 2021/0335884 | A1 | 10/2021 | Wang | |

FOREIGN PATENT DOCUMENTS

| | | |
|---|---|---|
| CN | 110190083 | 8/2019 |
| JP | 2013-168507 | 8/2013 |

OTHER PUBLICATIONS

Kioupakis et al., Interplay of Polarization Fields and Auger Recombination in the Efficiency Droop of Nitride Light-Emitting Diodes, Applied Physics Letter, 101, 231107, Dec. 5, 2012, Retrieved from ,http://dx.doi.org/10.1063/1.4769374>.

International Search Report on related PCT Application No. PCT/US2020/061076 from International Searching Authority (KIPO) dated Mar. 12, 2021.

Written Opinion on related PCT Application No. PCT/US2020/061076 from International Searching Authority (KIPO) dated Mar. 12, 2021.

European Search Report from related EP Application No. 20889666.2 from European Patent Office (EPO) dated Nov. 27, 2023.

Feng et al., Quantum-Well-Base Heterojunction Bipolar Light-Emitting Transistor, Applied Physics Letters, vol. 84, No. 11, Mar. 15, 2004, pp. 1952-1954.

Medina et al., LED Based Visible Light Communication: Technology, Applications and Challenges—A Survey, International Journal of Advances in Engineering & Technology, vol. 8, Issue 4, pp. 482-495, Aug. 31, 2015, [retrieved on Feb. 23, 2020], Retrieved from <Researchgate, https://www.researchgate.net/publication/281408421> <doi:10.7323/ijaet/v8_iss4>.

Satadal et al., Monolithic Optical Link in Silicon-On-Insulator CMOS Technology, Optics Express, vol. 25, No. 5, Feb. 28, 2017, p. 5440. Retrieved from: https://opg.optica.org/directpdfaccess/38e2081f-e7fc-41c8-86f79e6666e61141_360465/ce-25-5-5440.pdf/da=1&id=360465&seq=0&mobile=no.

Rajbhandari et al., "A review of gallium nitride LEDs for multi-gigabit-per-second visible light data communications" Semiconductor Science Technology, IOP Publishing Ltd, GB, vol. 32, No. 2, Jan. 4, 2017, pp. 1-40.

Shi et al., "The improvement in modulation speed of GaN-based Green light-emitting diode (LED) by use of n-type barrier doping for plastic optical fiber (POF) communication", IEEE Photonics Technology Letters, vol. 18, No. 15, Aug. 1, 2006, pp. 1636-1638.

Extended European Search Report in related European Application No. 20889244.8 dated Jan. 26, 2024.

International Search Report from Searching Authority (KIPO) in related PCT Application No. PCT/US2020/061101 dated Mar. 11, 2021.

Written Opinion from Searching Authority (KIPO) in related PCT Application No. PCT/US2020/061101 dated Mar. 11, 2021.

* cited by examiner

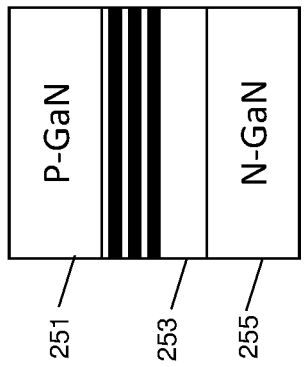
Fig. 2A
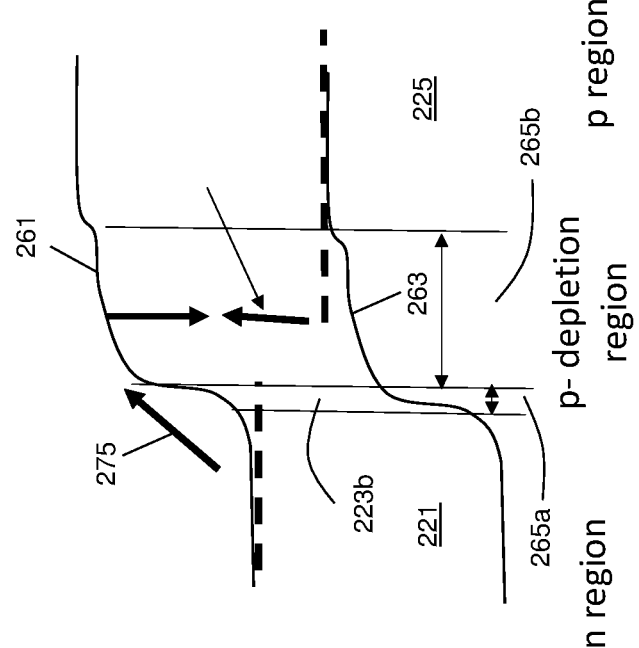
Fig. 2B
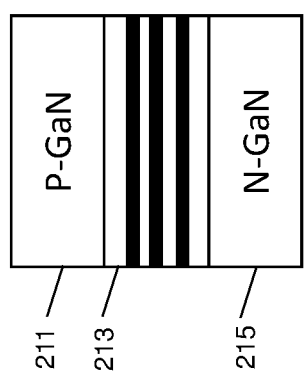
Fig. 3A
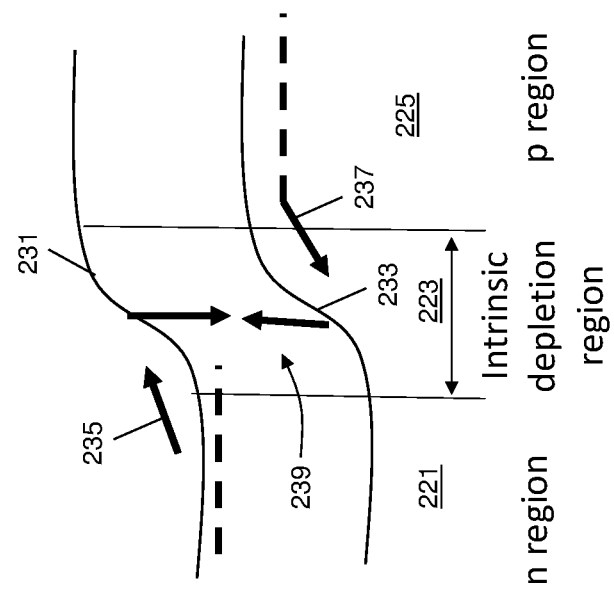
Fig. 3B: GaN LED with p- depletion/recombination region

| Parameter | Disadvantages | Advantages | Standard microLED design | Design for high speed |
|---|---|---|---|---|
| Diameter (make small) | If the microLED is too small, surface recombination around the edge can reduce quantum efficiency. | Higher carrier density means faster speed at a given current. Edge effects will speed up the LED at the price of efficiency. | 10 um | 1um (0.3um – 2um) |
| # of QWs (reduce number) | At high temperature a single QW might lead to carrier overflow – not all the carriers get trapped in the QW and efficiency is reduced | Fewer QWs means more carriers per QW, which in turn means higher speed | 5 | 1 (1-3) |
| Wavelength (as set by indium content) (make short) | Too small indium content and you get carrier overflow and poor performance at high temperature | Smaller indium % gives lower piezoelectric field, which means greater hole-electron wavefunction overlap and faster speed. Also reduced Auger recombination | 430nm-650nm | 400nm (380nm-450nm) |
| Quantum well width (make small) | Poor confinement leading to carrier overflow at high temperature | Greater hole-electron wavefunction overlap, faster recombination time. | 5nm | 2nm (1nm-3nm) |
| Doping in QWs (increase level) | High doping in the QWs increases non-radiative recombination. Also increases capacitance. | Increases speed of the LED by reducing the recombination time | undoped | ≥ 1x17 /cm^3 ≥ (10^17-10^19) |

Table I

Fig. 5

HIGH SPEED AND MULTI-CONTACT LEDS FOR DATA COMMUNICATION

CROSS-REFERENCE TO RELATED APPLICATIONS

This application is a continuation of U.S. patent application Ser. No. 16/951,296, filed on Nov. 18, 2020, which claims the benefit of the filing date of U.S. Provisional Patent Application No. 62/936,767, filed on Nov. 18, 2019, and U.S. Provisional Patent Application No. 62/971,844, filed on Feb. 7, 2020, the disclosures of which are incorporated by reference herein.

BACKGROUND OF THE INVENTION

The present invention relates generally to LEDs, and more particularly to LEDs in an optical communication system.

Lasers tend to dominate optical communications on account of their narrow linewidth, single spatial mode output, and high-speed characteristics. The narrow linewidth of a laser means that high speed signals can pass through dispersive mediums for long distances without pulse broadening. Long distance fiber optic links are frequently limited by chromatic dispersion and thus a narrow linewidth laser may be essential for long distance fiber optic links. The single spatial mode of a laser is also relatively easy to couple to single mode fiber.

The stimulated emission of lasers may also allow for high modulation speeds. Directly modulated optical links may be able to run at 25 Gb/s easily, and potentially carry 50 Gb/s of information using PAM4 modulation.

However, use of lasers may present difficulties for optical communications for very short distances, such as chip to chip communications.

BRIEF SUMMARY OF THE INVENTION

Some embodiments provide a LED configured for high speed operation. In some embodiments the LED is used as part of a data communication system. In some embodiments the data communication system is an intra-chip, inter-chip, or intra-multi-chip module communication system. In some embodiments the LED is a microLED.

Some embodiments provide an optical communication system for communicating information provided by a processor to another area of the processor or another module in a multi-chip module, comprising: an LED associated with the processor; an LED driver to modulate output optical power of the LED, such that the LED will generate light based on data provided to the LED driver from the processor; a detector for performing optical electrical conversion using the light, the detector for example having an electrical output that is modulated by optical power incident on the detector; and an optical waveguide optically coupling light from the LED to the detector; wherein the LED comprises: a p type layer; an n type layer; and a lightly-doped recombination layer, the recombination layer including at least one quantum well between the p type layer and the n type layer. Some embodiments provide an optical communication system for communicating information provided by a first integrated circuit (IC), for example a processor, to another area of that first IC, or to second IC in a multi-chip module, comprising: an LED associated with the first IC; an LED driver for activating the LED to generate light based on data provided to the LED driver from the first IC; a detector for performing optical-electrical conversion using the light; and an optical waveguide optically coupling the LED and the detector; wherein the LED includes a plurality of etched vias. In some embodiments, the first and/or second IC is a processor.

These and other aspects of the invention are more fully comprehended upon review of this disclosure.

BRIEF DESCRIPTION OF THE FIGURES

FIG. 2A shows a typical p-i-n LED structure and FIG. 2B shows a band diagram for the device of FIG. 2A.

FIG. 3A shows an optimized doping structure for an LED, in accordance with aspects of the invention, and with FIG. 3B shows a band diagram for the device of FIG. 3A.

FIG. 5 includes a table indicating trade-offs in the design of the microLED with typical parameters

DETAILED DESCRIPTION

Figure 1:
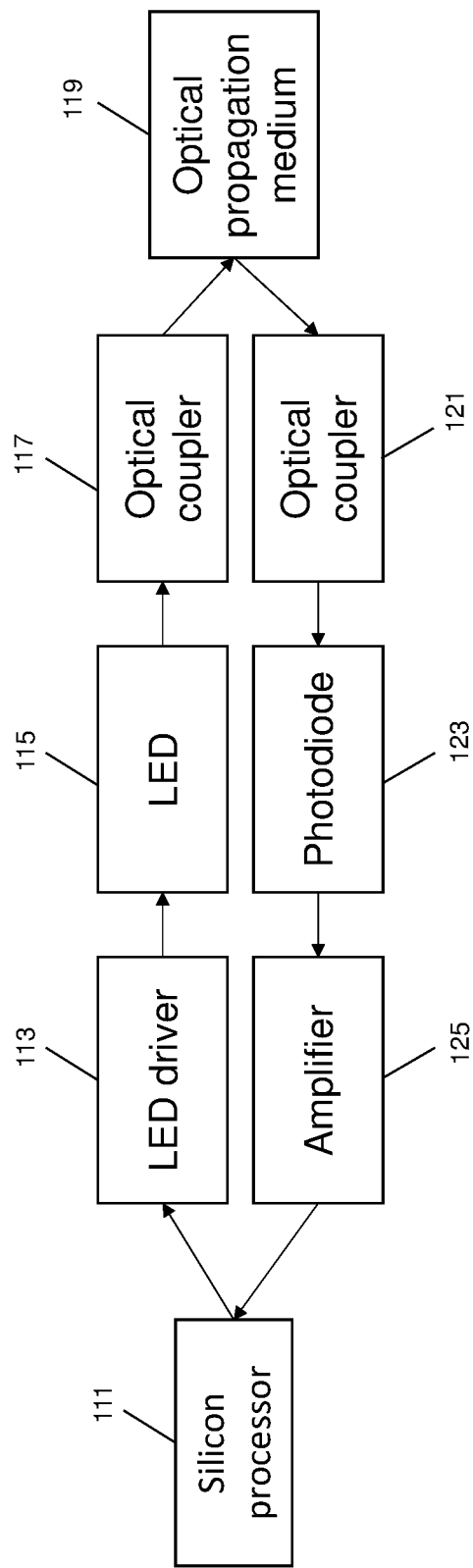
FIG. 1 is a block diagram showing an example of use of an LED, in accordance with aspects of the invention.

FIG. 1 shows an example of use of an LED, which may be a microLED in various embodiments, as variously discussed herein. In FIG. 1, a silicon processor 111 performs various operations on or with data. For example, the silicon processor may perform calculations on data, may perform switching functions, or may perform other functions. The silicon processor provides at least some of the data to an LED driver 113. The LED driver activates the microLED 115 so as to optically provide the at least some of the data from the processor, with the LED driver thereby modulating output optical power of the microLED so as to optically provide the at least some of the data from the processor. Light generated by the microLED is provided to an optical coupler 117, which passes the light into an optical propagation medium 119. The optical propagation medium, which may be for example a waveguide, may be used to transfer the light from one area of the silicon processor to another area of the silicon processor in some embodiments. In other embodiments, the optical propagation medium may be used to transfer light from the silicon processor to another silicon processor, or memory, or other chip, for example in a multi-chip module (not shown in FIG. 1) (with the term "chip" generally used interchangeably with "integrated circuit" or "IC," unless the context clearly indicates otherwise). In doing so, the optical propagation medium may transfer the light to another optical coupler 121, which in turn passes the light to a detector 123, for example a photodiode, for optical-electrical conversion. The electrical signal including the at least some of the data may be amplified by an amplifier 125, and provided to the silicon processor (or other chip in a multi-chip module). In some embodiments the microLEDs and detectors can be coupled to waveguides individually, and/or in some embodiments they may be coupled in parallel as arrays. The optical waveguides, in addition to transferring the light and the data from one position to another could also split the light into two or more outputs, allowing data fanout. The optical waveguides or medium could also perform some switching directing the output from one receiver to another receiver. As a person skilled in the art would necessarily understand, the optical links may be duplex, so that when there are one or more links from a first chip to a second chip, there may also be one or more links from the second chip to the first chip.

In some embodiments a microLED is distinguished from a semiconductor laser (SL) as follows: (1) a microLED does not have an optical resonator structure; (2) the optical output from a microLED is almost completely spontaneous emission, whereas the output from a SL is dominantly stimulated emission; (3) the optical output from a microLED is temporally and spatially incoherent, whereas the output from a SL has significant temporal and spatial coherence; (4) a microLED is designed to be driven down to a zero minimum current, whereas a SL is designed to be driven down to a minimum threshold current, which is typically at least 1 mA. In some embodiments a microLED is distinguished from a standard LED by (1) having an emitting region of less than 100 um×100 um (less than 10 um×10 um in some embodiments); (2) frequently having positive and negative contacts on top and bottom surfaces, whereas a standard LED typically has both positive and negative contacts on a single surface; (3) typically being used in large arrays for display and interconnect applications.

The microLEDs and detectors can be coupled to waveguides either individually or in parallel as arrays. In some embodiments the microLEDs are microLEDs with structures optimized for speed, for example high modulation speeds. In some embodiments the microLEDs are used for coupling optical data into waveguides, in some embodiments providing highly parallel communications between chips, for example on an interposer or through a 3D optical structure, for example an optical structure that includes optical waveguides and/or free-space optical propagation with optical elements such as lenses and holograms. GaN based microLEDs have been developed for display applications and a packaging ecosystem has been developed for mounting such devices on silicon or polysilicon-on-glass backplanes. With relatively minor modifications, elements of such a packaging ecosystem may be used in interconnecting ICs together for chip to chip communications.

In addition, for chip-to-chip communications, the distances are so short that material dispersion associated with the broad emission spectral width of the LED is not necessarily a problem. Simple calculations indicate that, for a GaN LED with a center wavelength in the range of 400 nm-450 nm and a 20 nm spectral width, if the LED is modulated at 4 Gb/s and propagates through a doped $SiO_2$ waveguide or fiber, the waveguide or fiber can be up to 5 meters long with a dispersion power penalty less than 2 dB. Since chip-to-chip communications inside of a multi-chip module (MCM) or across a PC board is typically less than tens of centimeters, the broad spectrum of an LED may not be an issue. Furthermore, one can even use highly multi-moded waveguides into which it is relatively easy to couple output light of an LED. Since the distances are short, modal dispersion of multimode waveguides may again not be an issue. At a 4 Gb/s signal rate, even in a waveguide with a 10% core-cladding index step that has an NA of 0.67, the waveguide length can be up to 85 cm with a small dispersion power penalty; smaller core-cladding index steps generally have longer reach. So broad spectrum LEDs and multi-mode waveguides are adequate in many embodiments for chip-to-chip communications.

Furthermore, in various embodiments the microLEDs are fabricated at very small sizes, with emitting area diameters of less than 2 um. Such a small device has very high brightness and generally can be coupled to a multimode waveguide with high coupling efficiency. Though the output is generally Lambertian, with proper use of reflectors, microlenses in some embodiments, and imbedding the microLED in waveguide in some embodiments, coupling efficiencies can be 30% or more. MicroLEDs typically have high quantum efficiencies, similar to or even surpassing that of lasers. Since over short distances one does not suffer much waveguide loss, even at the blue or green wavelengths, not much transmit power is required and a small microLED can be sufficient, running at less than 10 uA in some embodiments.

The achievable modulation speed of a microLED in general is limited by the carrier lifetime (and by capacitance if the microLED is too big), and generally cannot achieve the types of modulation speeds of lasers. However, clock speeds in microprocessors and logic seem to be reaching a limit of a few Gb/s. The input/output data of ICs is often sped up using serializer/de-serializers (SERDES) to produce a smaller number of higher speed lanes. For example, commercially available switch ICs may currently run at a few GHz clock speeds but communicate with 256 or 512 lanes of 50 Gb/s or 100 Gb/s per lane. These SERDES consume a great deal of electrical power and can be eliminated if the switch IC instead uses a larger number of lower speed lanes. Optical interconnects allow much higher parallelism and higher total throughput, even at slower lane speeds, by allowing the use of a much larger number of lanes. Nevertheless, getting LEDs to operate at modulation speeds that are as high as possible may be preferred.

Furthermore, microLEDs have substantial advantages over lasers in that they do not have a significant threshold current. Though quantum efficiency is a function of drive current, there is not a distinct threshold level, and moreover, microLEDs can be run at far lower currents than lasers. Given their usefulness for displays, there is a substantial infrastructure for mounting, connecting, and testing microLEDs on various substrates. And GaN microLEDs generally have far superior high temperature performance and reliability over semiconductor lasers.

Typically, a GaN microLED, optimized for display applications, comprises a cylindrical or cylindrical-like structure with a p-i-n doping profile. The LED is turned on by forward biasing the diode and injecting electrons from the n region and holes from the p region into the middle intrinsic region that contains InGaN quantum wells. A p contact is on one side of the structure, while an n contact is on the other. In many applications this cylinder is mounted onto a chip, where a "bottom" side electrically contacts the chip, and a "top" side contacts a common lead (e.g. a ground or power lead). The top side contact may be a transparent conductor such as indium-tin oxide (ITO). In microLEDs this "vertical" structure with contacts on the top and bottom of the LED is often preferred, but there are also "lateral" structures where the n contact and p contact are located on the same surface. In any case, there is no need to optimize these structures for speed because displays typically run at 60 Hz or 120 Hz frame rate, not at Gb/s.

There are changes that one can make to optimize the structure for speed. In general, a microLED is limited by the capacitance of the LED and the carrier recombination time. The capacitance forms an RC circuit with the driver's output impedance and causes a roll-off at high frequencies. The carrier lifetime causes the LED to take time to turn off, as one has to wait for the most of the minority injected carriers to recombine for the light emission to significantly decrease, even after the electrical pulse has ended. Due to their small size, the capacitance of microLEDs, generally just a few femto-Farads, does not significantly limit device modulation speed; rather, modulation speed is generally limited by carrier lifetime. Modulation speed can be increased by applying a reverse bias to the microLED and shaping the applied pulse electrically to pull the carriers out, but structural changes can also be made to the device to improve modulation speed.

A typical LED structure is comprised of a p type region, an "active" region where carriers recombine and light is emitted, and a n type region. There are numerous different LED structures that differ in the structure of the active region. In some embodiments, the active region contains one or more quantum wells (QWs)

Generally the speed of a microLED increases with current level. There are three ways that carriers can recombine in LEDs. At low current levels, the recombination is mediated by traps (known as SRH recombination). At higher current densities these traps become saturated and the quantum efficiency of the LED improves, as radiative recombination dominates. This radiative recombination rate speeds up as the carrier density increases, increasing the radiative efficiency and reducing the carrier lifetime. Thus, the harder (e.g. greater current densities) the microLEDs are driven, the faster they operate. At high current densities, nonlinear non-radiative mechanisms such as Auger recombination further reduces carrier lifetime, but these non-radiative mechanisms also reduce the radiative quantum efficiency. For a fast microLED with a small diameter to increase the current density at a given current, the traps are relatively unimportant as they are saturated, and the relative significance of nonlinear nonradiative recombination versus radiative recombination rate determines the quantum efficiency.

Some embodiments utilize a p, p-, n structure where the "intrinsic region" is doped p- type at reasonable levels—$10^{16}/cm^3$ to $10^{17}/cm^3$ in some embodiments. In some embodiments compared to a p-i-n structure, this results in a much narrower depletion width in the p- region. Electrons, which have high mobility, are injected into the p- depletion region that already has a high density of holes. Since the carrier recombination time is a function of the carrier density, the speed of the device increases as the depletion width decreases. The carrier recombination time is also a function of the product of the electron and hole densities, and p- doping in the depletion region increases the density of holes, thus increasing the recombination rate and decreasing the recombination time. The narrower depletion region may also have the undesirable effect of increasing the microLED's capacitance, but this may not be important for structures with very small diameters since the RC time constant will still be much smaller than the recombination time.

FIG. 2A shows a typical p-i-n LED structure and FIG. 3A shows an optimized doping structure, with FIGS. 2B and 3B also showing associated band diagrams for the devices of FIGS. 2A and 3A, respectively. The device of FIG. 2A has a p doped GaN layer 211 and an n doped GaN layer 215 sandwiching an intrinsic region 213 having InGaN quantum wells. The device of FIG. 3A also has a p doped GaN layer 251 and an n doped GaN layer 255 sandwiching an intermediate region. The intermediate region in the device of FIG. 3A, however, is doped p- type, and also contains InGaN quantum wells. In some embodiments the quantum wells are located physically closer to the p doped GaN layer than the n doped GaN layer.

The band diagram of FIG. 2B shows a conduction band 231 above a valence band 233, across an n region 221, an intrinsic/depletion region 223, and a p region 125. A bandgap between the conduction band and the valence band is generally constant across the regions, with energy levels generally increasing in the intrinsic/depletion region generally increasing in the intrinsic/depletion region between the n and p regions, such that energy levels are higher in the p region than the n region. Electrons are injected 235 from the n region into the intrinsic/depletion region, holes are injected 237 from the p region into the intrinsic/depletion region, in which recombination 239 occurs.

The band diagram of FIG. 3B also shows a conduction band 261 above a valence band 263, across an n region 221, a depletion/p- region 265a,b, respectively, and a p region 225. Compared to the band diagram of FIG. 2B, it may be seen in FIG. 3B that the depletion/p- region replaces the intrinsic/depletion region, with the depletion region 265 adjacent the n region and the p- region 265b adjacent the p region 225. A bandgap between the conduction band and the valence band is generally constant across the regions, with energy levels generally increasing in the depletion/p- region, primarily in the depletion region, are higher in the p region 225 than the n region 221.

FIG. 3B, compared to FIG. 2A, also shows electron injection 275 over a much thinner depletion region into the p- region and the recombination is generally occurring there. In the GaN material system, the increase in background doping may decrease the radiative recombination time by at least an order of magnitude or a few orders of magnitude.

Though FIG. 3A shows a p, p-, n structure, one could also dope the quantum wells n type rather than p type. This also increases the speed the microLED compared to a p-i-n structure. The advantage of n doping versus p doping is that n doping does not increase defects and would not reduce radiative efficiency. The doping level can also be further increased to reduce the carrier recombination time at the price of a higher capacitance.

Some embodiments include further modifications to the doped structure of FIG. 3B that may further improve the performance. For example, some embodiments use an AlGaN barrier on the n region to further enhance injection of carriers into the p- doped recombination region and prevent hole injection into the n type region. Some embodiments optimize InGaN quantum wells in the p- region in terms of number, width, and strain to decrease recombination time. For example, a lower In concentration that pushes the wavelength to shorter wavelengths also increases the speed. Thus, microLEDs with wavelengths between 380 nm to 430 nm may be intrinsically faster than those at longer wavelengths. Fewer quantum wells also increase the carrier density in the quantum well for a given current. The carrier recombination time decreases faster as carrier density increases. So in some embodiments the microLED has only one or a few quantum wells. In some embodiments the quantum well width is also made smaller. A smaller quantum well width brings the electrons and holes closer together, with an increased overlap integral and reduced radiative recombination time. Some embodiments use an appropriate GaN substrate for growth to reduce the built-in electric field in the quantum wells, increasing the overlap integral between the electrons and holes and thus further reducing carrier recombination time. One can also reduce the built-in field by going to a smaller mole fraction of indium, once again getting faster response in the short wavelength range. A smaller indium concentration also lowers the Auger recombination rate, increasing the quantum efficiency of the LED.

In some embodiments the structure optimized for high speed operation has a small size, with a diameter of less than about two microns to increase the current density and the carrier density. In some embodiments the structure optimized for high speed operation has few quantum wells, perhaps only one, so that at a given current density the carrier density is maximized. In some embodiments the indium concentration of the quantum well is low, thus the microLED would emit at shorter wavelength, for example blue or ultraviolet wavelengths, as a smaller indium concentration would give a lower piezo-electric field that increases the hole-electron wavefunction overlap integral and thus increases recombination rate. In some embodiments the quantum well is small, typically 2 nm or less, to increase the overlap between electrons and holes. In some embodiments the quantum wells are doped either p type or n type to increase the background carrier density.

Table I of FIG. 5 describes the trade-offs in the design of the microLED with typical parameters.

In general, higher doping also decreases the non-radiative recombination time. This further shortens the carrier lifetime and increases the modulation speed, but with a penalty of reduced quantum efficiency. Once again, in these very short distance applications where there is little waveguide propagation loss, quantum efficiency be less important than modulation speed. Fundamentally, there is a trade-off between quantum efficiency and modulation speed: the overall LED recombination rate can be increased by increasing the non-radiative recombination rate, which in turn reduces the quantum efficiency. Accordingly, in some embodiments the speed an LED is increased, dramatically in some embodiments, at the price of a lower quantum efficiency.

Fast recombination centers can be induced in the LED by a number of processes. These include a lower temperature growth of the crystal in the intrinsic region, proton implantation, deliberately induced defect density using dislocations in the crystal lattice, roughening the etched surface, or increasing the exposed surface area through other techniques.

Figure 4:
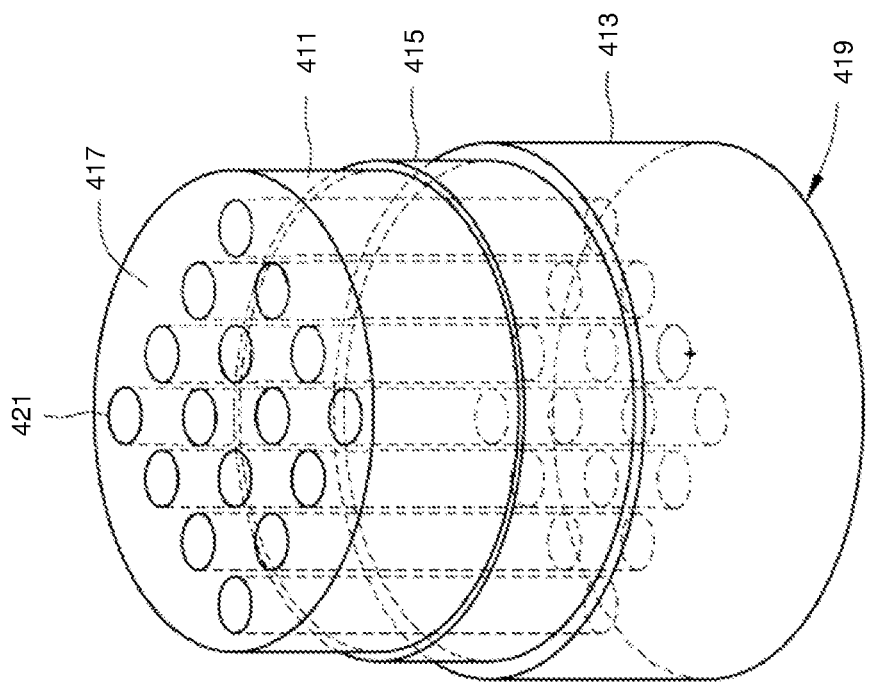
FIG. 4 shows a microLED with etched vias, in accordance with aspects of the invention.

Generally, smaller microLEDs tend to have lower quantum efficiencies because carriers diffuse and recombine at the etched outer surface. This reduces the carrier lifetime, and therefore also increases the speed of the microLED. This effect can be increased by etching structural holes or vias in the structure that expose more area in the via sidewalls, creating more recombination centers. FIG. 4 shows a microLED with etched vias. The example of FIG. 4 shows a microLED with a generally cylindrical shape, extending between a circular base 419 to a circular top 417. The microLED may include a base layer 413 (which may be, e.g., an n GaN layer) extending upward from the circular base and a top layer 411 (which may be, e.g., a p GaN layer) extending downward from the circular top. A middle layer 415 is between the base layer and the top layer, and the middle layer may provide, as one would understand, an intrinsic depletion region or a p– depletion region.

The microLED of FIG. 4 also includes etched vias, for example etched via 421, extending from the circular top to the circular bottom. The etched vias therefore provide apertures through the microLED, from the top surface to the bottom surface. In FIG. 4, the etched vias are of circular cross-section, thereby forming a cylindrical via, with the vias generally arranged in a square or diamond pattern. The etched vias may induce non-radiative recombination at the exposed surface to reduce the carrier lifetime and therefore increase the speed. This may provide a more controllable method than proton implant or lower temperature growth. In this case when the device is etched to form the microLED, various structures can be used to increase the surface area. These include etching multiple pillars in some embodiments, and/or etched vias, as the figure shows. Other shapes such as stars or roughened edges may also or instead be used in some embodiments.

Although the invention has been discussed with respect to various embodiments, it should be recognized that the invention comprises the novel and non-obvious claims supported by this disclosure.

What is claimed is:

1. An optical communication system for communicating information provided by a processor to another area of the processor or another chip in a multi-chip module, comprising:
    an LED associated with the processor;
    an LED driver to modulate optical output power of the LED, such that the LED will generate light based on data provided to the LED driver from the processor;
    a detector for performing optical-electrical conversion using the light; and
    an optical waveguide optically coupling light from the LED to the detector;
    wherein the LED is mounted on a surface, the LED having a structure comprising:
        a p type layer having a p contact for electrical contacting;
        an n type layer having an n contact for electrical contacting;
        an intermediate region between the p type layer and the n type layer, the intermediate region being doped and including at least one quantum well, the at least one quantum well located physically closer to the p type layer than the n type layer;
        wherein the structure of the LED is a lateral structure such that the p contact and the n contact both contact the surface that the LED is mounted on.

2. The system of claim 1, wherein the intermediate region comprises p– doping.

3. The system of claim 2, wherein the p– doping is in the range of $10^{16}/cm^3$ to $10^{17}/cm^3$.

4. The system of claim 1, wherein the intermediate region comprises n– doping.

5. The system of claim 1, wherein the LED is a microLED.

6. The system of claim 5, wherein the at least one quantum well has a width ranging between 1 nanometer to 3 nanometers.

7. The system of claim 5, wherein the microLED has a diameter size ranging between 0.3 micrometers to 2 micrometers.

8. The system of claim 1, wherein the p type layer and the n type layer are comprised of GaN and the at least one quantum well comprises InGaN.

9. The system of claim 1, further comprising:
    a further LED associated with the other area of the processor or other chip in the multi-chip module;
    a further LED driver to modulate optical output power of the further LED, such that the further LED will generate light based on data provided to the further LED driver from the other area of the processor or other chip in the multi-chip module; and
    a further detector for performing optical-electrical conversion using the light from the further LED;
    wherein the further LED comprises:
        a p type layer;
        an n type layer;
        an intermediate region between the p type layer and the n type layer, the intermediate region being doped and including at least one quantum well, the at least one quantum well located physically closer to the p type layer than the n type layer.

10. The system of claim 9, wherein the optical waveguide optically couples light from the further LED to the further detector.

11. The system of claim 1, wherein the at least one quantum well is between 1 and 3 quantum wells.

* * * * *